US009420678B2

(12) United States Patent
Bykanov et al.

(10) Patent No.: US 9,420,678 B2
(45) Date of Patent: Aug. 16, 2016

(54) SYSTEM AND METHOD FOR PRODUCING AN EXCLUSIONARY BUFFER GAS FLOW IN AN EUV LIGHT SOURCE

(71) Applicant: KLA-Tencor Corporation, Milpitas, CA (US)

(72) Inventors: Alexander Bykanov, San Diego, CA (US); Oleg Khodykin, San Diego, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/497,506

(22) Filed: Sep. 26, 2014

(65) Prior Publication Data
US 2015/0008335 A1  Jan. 8, 2015

Related U.S. Application Data

(63) Continuation of application No. PCT/US2014/016299, filed on Feb. 13, 2014.

(60) Provisional application No. 61/764,537, filed on Feb. 14, 2013.

(51) Int. Cl.
*H05G 2/00* (2006.01)
*G21K 5/04* (2006.01)
*G03F 7/20* (2006.01)

(52) U.S. Cl.
CPC ............ *H05G 2/008* (2013.01); *G03F 7/70033* (2013.01); *G03F 7/70916* (2013.01)

(58) Field of Classification Search
USPC .......................................... 250/493.1, 504 R
See application file for complete search history.

(56) References Cited

U.S. PATENT DOCUMENTS

| 6,566,667 | B1 | 5/2003 | Partlo et al. |
| 7,812,329 | B2 | 10/2010 | Bykanov et al. |
| 8,586,954 | B2 | 11/2013 | Asayama et al. |
| 2003/0006383 | A1 | 1/2003 | Melnychuk et al. |
| 2007/0018119 | A1 | 1/2007 | Yabuta et al. |
| 2008/0073598 | A1 | 3/2008 | Moriya et al. |
| 2008/0212044 | A1 | 9/2008 | Derra et al. |
| 2010/0141909 | A1* | 6/2010 | Wassink .............. G03F 7/70858 355/30 |
| 2011/0109892 | A1 | 5/2011 | Van Herpen et al. |
| 2012/0080619 | A1 | 4/2012 | Kleinschmidt |
| 2012/0119116 | A1 | 5/2012 | Kakizaki et al. |
| 2013/0001442 | A1 | 1/2013 | Schepers et al. |

FOREIGN PATENT DOCUMENTS

| DE | 102011089090 A1 | 6/2013 |
| EP | 2181448 A1 | 5/2010 |
| WO | 0195362 A1 | 12/2001 |

* cited by examiner

*Primary Examiner* — Nicole Ippolito
(74) *Attorney, Agent, or Firm* — Simpson & Simpson, PLLC

(57) ABSTRACT

A system for producing an exclusionary buffer gas flow in an EUV light source, comprising a vacuum chamber, a light path, a plasma generation region, at least one shield, at least one through-bore arranged in the at least one shield, at least one buffer gas injector arranged within the at least one through-bore to inject a buffer gas into the light path substantially towards the plasma generation region to prevent a flow of a target material into the light path, and a vacuum pump arranged to remove the buffer gas and the target material from the vacuum chamber.

18 Claims, 1 Drawing Sheet

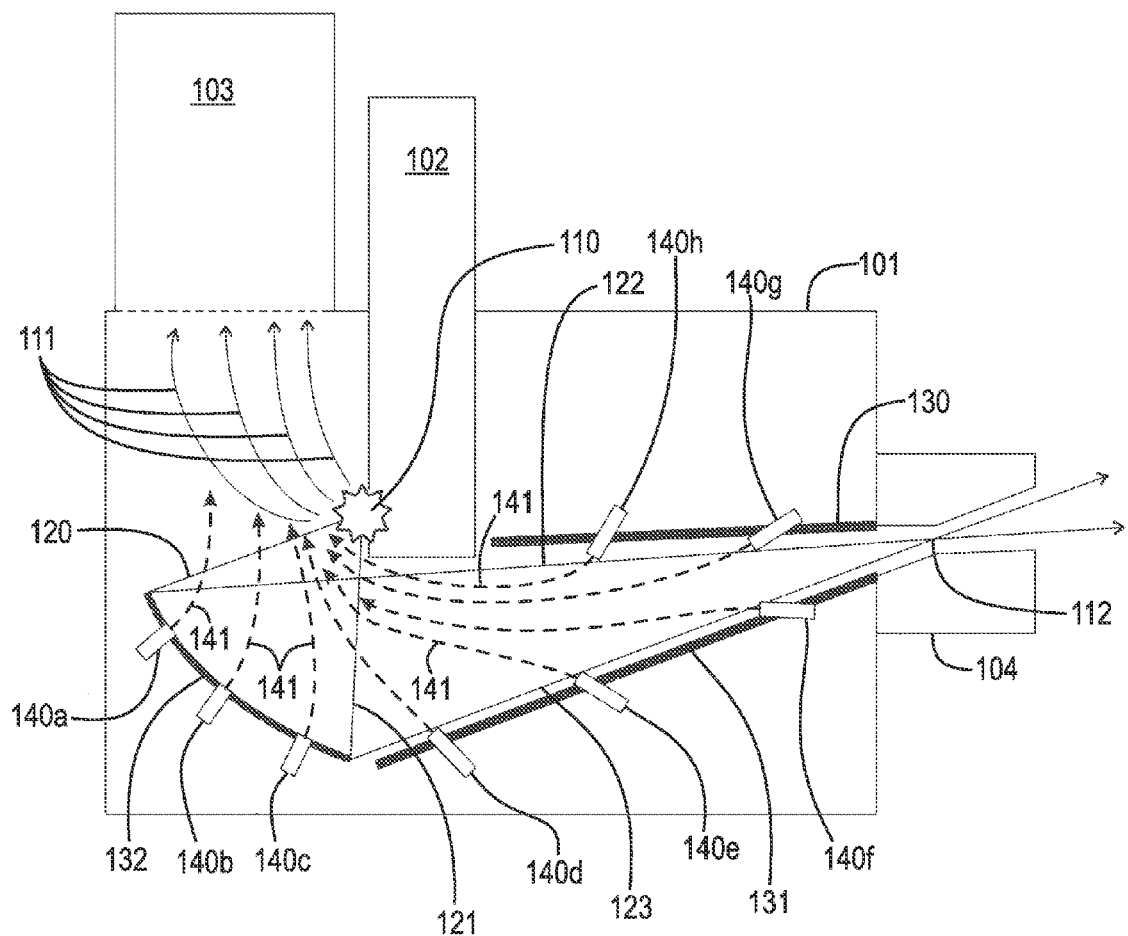

SYSTEM AND METHOD FOR PRODUCING AN EXCLUSIONARY BUFFER GAS FLOW IN AN EUV LIGHT SOURCE

CROSS-REFERENCE TO RELATED APPLICATIONS

This application is filed under 35 U.S.C. §120 and §365(c) as a continuation of International Patent Application Serial No. PCT/US14/16299, filed on Feb. 13, 2014, which application claims the benefit under 35 U.S.C. 119(e) of U.S. Provisional Patent Application No. 61/764,537, filed Feb. 14, 2013, which applications are incorporated herein by reference in their entirety.

TECHNICAL FIELD

The present invention relates to a system and method for producing an exclusionary buffer gas flow in an extreme ultra-violet (EUV) light source. In particular, the present invention relates to a system and method for using buffer gas to prevent the target material in a laser produced plasma EUV light source from entering the light path of the EUV light, thereby reducing attenuation of the EUV light by the target material.

BACKGROUND

EUV light, which is defined as electromagnetic radiation with wavelengths between 124 nm and 10 nm, is used in next-generation photolithography systems to produce structures smaller than is possible with current ultra-violet light sources, such as excimer lasers. One method of generating EUV light is by using a laser to transform a target material, such as xenon or tin, into plasma, which plasma then emits radiation in the EUV portion of electromagnetic spectrum.

One of the difficulties encountered with this type of laser produced plasma EUV light source is the attenuation of the EUV light by amounts of the target material in the path of the EUV light as it leaves the light source. EUV light is strongly absorbed by many substances, including xenon and tin. For example, if the EUV light travels 2 m through xenon at 4 mTorr, which conditions are typical inside extant EUV light sources, approximately 50% of the EUV light will be absorbed by the xenon. This attenuation of the EUV light necessitates generating EUV light at a greater power than is needed for the application, with a corresponding increase in system, operation, and maintenance costs for the EUV light source.

Although the plasma that produces the EUV light is created in a vacuum chamber, which chamber is kept at relatively low pressure by a vacuum pump, injection of target material into the vacuum chamber for plasma generation, movement by currents of buffer gasses, and diffusion results in amounts of the target material throughout the vacuum chamber, including in the EUV light path. Further, some regions of the vacuum chamber may be "stagnation zones" in which target material is not easily removed from the vacuum chamber due to limited interaction with the flows of buffer gas and target material into the vacuum pump.

Thus, what is needed is a system for preventing highly attenuating target material from entering the EUV light path in an EUV light source and for effectively removing the target material from the EUV light source after it is used in the laser produced plasma process.

SUMMARY

According to aspects illustrated herein, there is provided a system for producing an exclusionary buffer gas flow in an EUV light source, comprising a vacuum chamber, a light path, a plasma generation region, at least one shield, at least one through-bore arranged in the at least one shield, at least one buffer gas injector arranged within the at least one through-bore to inject a buffer gas into the light path substantially towards the plasma generation region to prevent a flow of a target material into the light path, and a vacuum pump arranged to remove the buffer gas and the target material from the vacuum chamber.

According to aspects illustrated herein, there is provided a method for producing an exclusionary buffer gas flow in an EUV light source, comprising injecting a buffer gas from at least one buffer gas injector towards a plasma generation region, advecting a target material away from a light path using a flow of the buffer gas and removing the buffer gas and the target material from a vacuum chamber with a vacuum pump.

These and other objects and advantages of the present disclosure will be readily appreciable from the following description of the invention and from the accompanying drawings and claims.

BRIEF DESCRIPTION OF THE DRAWINGS

Various embodiments are disclosed, by way of example only, with reference to the accompanying schematic drawing in which:

FIG. 1 is a schematic representation of a system for producing an exclusionary buffer gas flow in an EUV light source.

DETAILED DESCRIPTION

At the outset, it should be understood that the disclosure as claimed is not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the present disclosure.

Unless defined otherwise, all technical and scientific terms used herein have the same meaning as commonly understood to one of ordinary skill in the art to which this disclosure belongs. It should be understood that any methods, devices or materials similar or equivalent to those described herein can be used in the practice or testing of the disclosure.

FIG. 1 is a schematic representation of a system for producing an exclusionary buffer gas flow in an extreme ultra-violet (EUV) light source. EUV light, which is defined as electromagnetic radiation with wavelengths between 124 nm and 10 nm, is strongly absorbed by many substances, including xenon and tin, which are commonly used as target materials in the laser produced plasma EUV light generation process. EUV light is also absorbed by other substances, but the absorption effects can be much less. For example, the absorption cross section of EUV photons in the band commonly used in photolithography is $25.3 \times 10^{-18}$ cm$^2$ for xenon, $0.05 \times 10^{-18}$ cm$^2$ for H$_2$, $0.53 \times 10^{-18}$ cm$^2$ for helium, and $1.39 \times 10^{-18}$ cm$^2$ for argon. This means that argon has a cross-section approximately 18 times smaller than that of xenon, with H$_2$ and helium smaller still. Therefore, after the target material is used to generate EUV light, it is beneficial to prevent it from entering the path of the EUV light as it leaves the EUV light source, even if this exclusion comes at the cost of introducing other substances into the light path.

Vacuum chamber 101 is a low pressure container in which the plasma that serves as the EUV light source is created and the resulting EUV light is collected and focused. As discussed above, EUV light is strongly absorbed by most substances, thus, reducing the pressure within vacuum chamber 101 reduces the attenuation of the EUV light within the light source. Target material supply 102 injects or otherwise transfers an amount of the target material, such as xenon or tin, into vacuum chamber 101 at plasma generation region 110. Target material supply 102 is shown as a drum target, but it may also comprise a jet-type supply, a droplet-type supply, or other types of supplies used in laser produced plasma EUV light generation.

The EUV light generated by the plasma created at plasma generation region 110 is collected by collector 132 and directed to intermediate focus 112 in internal focus module 104. Extreme rays 120, 121, 122, and 123 define the light path of the EUV light, that is, the region within vacuum chamber 101 through which the EUV light travels on its way out of vacuum chamber 101. The EUV light within the light path defined by extreme rays 120-123 is the area of primary concern for EUV light attenuation.

Shields 130 and 131 comprise a solid, impermeable material that borders the light path defined by extreme rays 120-123. Shields 130 and 131 are arranged adjacent to the light path defined by extreme rays 120-123 to physically block target material elsewhere in vacuum chamber 101 from entering the light path defined by extreme rays 120-123. Shields 130 and 131 may comprise separate pieces, as depicted in FIG. 1, or shields 130 and 131 may comprise a single piece that envelops the light path defined by extreme rays 120-123. Shields 130 and 131 may also comprise a portion of the walls of vacuum chamber 101, or other walls within the system. Shields 130 and 131 and collector 132 have a plurality of through-bores, into which are secured buffer gas injectors 140a-140h. The number of buffer gas injectors 140a-140h may vary depending on the application, and buffer gas injectors may be secured only in the shields, only in the collector, or in both the shields and the collector. Buffer gas is commonly injected into laser produced plasma EUV light sources to prevent amounts of the target material or ions thereof from damaging or fouling the various surfaces, optics, and sensors in the EUV light source. Common buffer gasses include helium, argon, and $H_2$, but other gasses may be used as well. Buffer gas protects the interior of an EUV light source by moving the target material through advection away from sensitive surfaces. The target material and buffer gas are then removed from the EUV light source by a vacuum pump.

Buffer gas injectors 140a-140h may individually comprise single or multiple tubes or nozzles, and these individual tubes or nozzles may have different injection angles, lengths, nozzle diameters, and locations. Buffer gas injectors 140a-140h are arranged to inject buffer gas into vacuum chamber 101 in such a way as to prevent target material from entering the light path defined by extreme rays 120-123. This exclusionary effect is created by a flow of buffer gas, as depicted by dotted lines 141, substantially towards plasma generation region 110. The flow of buffer gas 141 created by the directional injection of buffer gas by buffer gas injectors 140a-140h encounters an amount of target material at plasma generation region 110, and by advection, creates a flow of target material, as depicted by solid lines 111, towards vacuum pump 103. The number, angles, locations, and diameters of buffer gas injectors 140a-140h may be adjusted to optimize the flow of buffer gas 141, thereby preventing amounts of target material from entering the light path defined by extreme rays 120-123.

Vacuum pump 103 is connected to vacuum chamber 101 and arranged to remove both buffer gas and target material from vacuum chamber 101. By actively directing the flow of buffer gas 141 towards plasma generation region 110, which in an embodiment, is the primary entrance point of target material into vacuum chamber 101, it is possible to prevent amounts of target material from entering the light path defined by extreme rays 120-123 or accumulating in "stagnation zones" within vacuum chamber 101. In other embodiments, the target material may be supplied by other means, such as in a stream of droplets or jet of target material, which entrance point into vacuum chamber 101 may not be at plasma generation region 110. After it is used in the plasma generation process, a flow of target material 111 is directed towards vacuum pump 103 by the flow of buffer gas 141 and removed from vacuum chamber 101.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A system for producing an exclusionary buffer gas flow in an EUV light source, comprising:
   a vacuum chamber;
   a light path;
   a plasma generation region;
   at least one shield;
   at least one through-bore arranged in the at least one shield;
   at least one buffer gas injector arranged within the at least one through-bore to inject a buffer gas into the light path such that the buffer gas is directed by the at least one buffer gas injector substantially towards the plasma generation region to prevent a flow of a target material from entering the light path and from coming in contact with the at least one shield; and,
   a vacuum pump arranged to remove the buffer gas and the target material from the vacuum chamber.

2. The system of claim 1, further comprising:
   a collector;
   at least one collector through-bore arranged in the collector; and,
   at least one collector buffer gas injector arranged within the at least one collector through-bore to inject the buffer gas into the light path substantially towards the vacuum pump to prevent the flow of the target material into the light path.

3. The system of claim 1, wherein the buffer gas is selected from the group consisting of argon, hydrogen, and helium.

4. The system of claim 1, wherein the at least one shield is arranged to prevent the target material from entering the light path.

5. The system of claim 1, wherein at least one of the at least one buffer gas injector comprises a plurality of buffer gas injection nozzles.

6. The system of claim 5, wherein a first buffer gas injection nozzle in the plurality of buffer gas injection nozzles injects the buffer gas at a first buffer gas injection angle, a second buffer gas injection nozzle in the plurality of buffer gas injection nozzles injects the buffer gas at a second buffer gas injection angle, and the first buffer gas injection angle is not equal to the second buffer gas injection angle.

7. The system of claim 5, wherein a first buffer gas injection nozzle in the plurality of buffer gas injection nozzles has a first buffer gas nozzle diameter, a second buffer gas injection nozzle in the plurality of buffer gas injection nozzles has a second buffer gas nozzle diameter, and the first buffer gas nozzle diameter is not equal to the second buffer gas nozzle diameter.

8. The system of claim 1, wherein the at least one buffer gas injector comprises a plurality of buffer gas injectors.

9. The system of claim 8, wherein a first buffer gas injector in the plurality of buffer gas injectors has a first buffer gas injection angle, a second buffer gas injector in the plurality of buffer gas injectors has a second buffer gas injection angle, and the first buffer gas injection angle is not equal to the second buffer gas injection angle.

10. The system of claim 8, wherein a first buffer gas injector in the plurality of buffer gas injectors has a first buffer gas injector diameter, a second buffer gas injector in the plurality of buffer gas injectors has a second buffer gas injector diameter, and the first buffer gas injector diameter is not equal to the second buffer gas injector diameter.

11. The system of claim 1, wherein an orientation of each of the at least one buffer gas injector is optimized to efficiently prevent the flow of the target material into the light path.

12. The system of claim 1, wherein the buffer gas is directed by the at least one buffer gas injector to prevent the target material from accumulating in a stagnation zone.

13. A method for producing an exclusionary buffer gas flow in an EUV light source, comprising:
   injecting a buffer gas from at least one buffer gas injector such that the buffer gas is directed by the at least one buffer gas injector towards a plasma generation region;
   advecting a target material such that it does not enter a light path using a flow of the buffer gas; and,
   removing the buffer gas and the target material from a vacuum chamber with a vacuum pump.

14. The method of claim 13, wherein the at least one buffer gas injector is arranged within a through-bore in a shield.

15. The method of claim 13, wherein at least one of the at least one buffer gas injector is arranged within a collector through-bore in a collector.

16. The method of claim 13, wherein the target material is substantially located at the plasma generation region.

17. The method of claim 13, wherein an orientation of each of the at least one buffer gas injector is optimized to efficiently advect the target material towards the vacuum pump.

18. The method of claim 13, wherein the buffer gas is directed by the at least one buffer gas injector to prevent the target material from accumulating in a stagnation zone.

* * * * *